(12) United States Patent
Yamamoto et al.

(10) Patent No.: US 6,234,873 B1
(45) Date of Patent: *May 22, 2001

(54) SEMICONDUCTOR MIRROR-POLISHED SURFACE WAFERS AND METHOD FOR MANUFACTURING THE SAME

(75) Inventors: Hiroaki Yamamoto; Akihiro Ishii; Kouichi Imura, all of Miyazaki (JP)

(73) Assignee: Komatsu Electronic Metals Co., Ltd., Hiratsuka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/179,934

(22) Filed: Oct. 28, 1998

(30) Foreign Application Priority Data

Oct. 30, 1997 (JP) .................................................... 9-298043

(51) Int. Cl.[7] ........................... H01L 21/304; B24B 49/00
(52) U.S. Cl. ............................... 451/41; 451/54; 451/70; 438/692; 216/88; 216/89
(58) Field of Search .................................. 451/41, 54, 69, 451/70, 285, 287, 288; 438/690, 691, 692, 693; 216/88, 89

(56) References Cited

U.S. PATENT DOCUMENTS

| 4,276,114 | * | 6/1981 | Takano et al. | 451/54 |
| 5,285,597 | * | 2/1994 | Hinzen | 451/70 |
| 5,329,733 | * | 7/1994 | Steere, Jr. | 451/70 |
| 5,351,446 | * | 10/1994 | Langsdorf | 451/69 |
| 5,800,725 | * | 9/1998 | Kato et al. | 216/88 |
| 5,976,983 | * | 11/1999 | Miyazaki et al. | 438/692 |

FOREIGN PATENT DOCUMENTS 6-349795    12/1994 (JP) .

* cited by examiner

Primary Examiner—Eileen P. Morgan
(74) Attorney, Agent, or Firm—Oliff & Berridge, PLC

(57) ABSTRACT

A method for manufacturing semiconductor wafers is provided. According to this invention, wafers are obtained by slicing a single-crystal semiconductor ingot. The sliced wafers are beveled at their peripheral rims. The beveled wafers are flattened by a lapping process. The front and the rear surfaces of the flattened wafers are spin-etched with an acid etchant liquid. The glossiness of the rear surfaces of the spin-etched wafers is controlled to a value of 130–300 %. The front surfaces of the wafers whose rear surfaces have been spin-etched are polished, thereby obtaining mirror-polished surfaces. The front surfaces may also be spin-etched prior to polishing.

10 Claims, 2 Drawing Sheets

SEMICONDUCTOR MIRROR-POLISHED SURFACE WAFERS AND METHOD FOR MANUFACTURING THE SAME

BACKGROUND OF THE INVENTION

1. Field of the Invention

The present invention relates to a semiconductor mirror-polished surface wafer whose front and rear surfaces can be distinguished. In particular, the present invention relates to a semiconductor mirror-polished surface wafer whose rear surface is acid-etched and a method for manufacturing the semiconductor mirror-polished surface wafers.

2. Description of the Prior Art

In an ordinary device manufacturing process, the rear surface of a semiconductor mirror-polished surface wafer is always sucked and held by a sucker and circuits are formed on the front surface. When, only the front surface of the semiconductor mirror-polished surface wafer is mirror-polished and the roughness of the rear surface remains unpolished, due to the suction force, the unevenness of the rear surface could transfer to the front surface. This will bring about a harmful effect to the device manufacturing process and lessen the yield of the device manufacturing process. Therefore, the both front and rear surfaces of a wafer are simultaneously or separately polished into mirror surfaces to avoid a decrease in the yield.

However, either surface of the two-sided mirror-polished surface wafer can not be distinguished from each other. In particular, in a manufacturing device provided with a sensor for detecting the front side and the rear side, an "error" sign appears if the sensor can not detect the rear side. Therefore, a semiconductor mirror-polished surface wafer, whose rear surface is nearly mirror-like and capable of being detected by the sensor, is required.

The method for manufacturing such a semiconductor mirror-polished surface wafer has been disclosed in, for example, Japanese Patent Laid-open No. 6-349795. In Japannese Patent Laid-open No. 6-349795, semiconductor mirror-polished surface wafers are alkali-etched, and then their rear surfaces are polished. The front surfaces are polished subsequent to the polishing of the rear surfaces. In the process of polishing the rear surfaces, the roughness of the rear surfaces brought about in the foregoing etching process is polished with a trivial amount being remained so as to enable the identification of the front surface and the rear surface. To maintain the flatness during manufacturing processes, the etching processes employed are limited to alkali etching processes.

However, problems other than flatness, induced during alkali etching processes, still exist; for example, particulate residue, dust and metal contamination.

Furthermore, in order to remove pits or control the glossiness of the wafers, the rear surfaces have to be polished. The time spent in polishing the rear surfaces would lessen the productivity.

SUMMARY OF THE INVENTION

In view of the above-described defects, an object of the present invention is to provide a semiconductor mirror-polished surface wafer whose rear surface is nearly mirror-like so as to enable the distinction of the front surface and the rear surface of the wafer. This invention is also intended to provide a highly productive method for manufacturing semiconductor mirror-polished surface wafers, which method can avoid particulate residue or metal contamination.

According to this invention, at least the rear surface of the wafer is spin-etched by an acid-etchant liquid to reach a glossiness value of 130–300%, and the front surface is made to a mirror surface (glossiness value greater than 300%). It is also satisfactory to spin-etch both front and rear surfaces of the wafer by an acid-etching liquid to reach a glossiness value of 130–300% and then to mirror-polish only the front surface of the wafer. As described hereinafter, both the flatness and the glossiness of the etched surface of the wafer treated by the acid spin-etching process are enhanced compared with conventional alkali-etching process or immersion type acid-etching process. Therefore, the load in the succeeding finishing process can be reduced and the productivity is accordingly enhanced.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

The first aspect of the mirror-polished surface wafer according to this invention is that the front surface is mirror finished and the glossiness of the rear surface is controlled by an acid-etching process to reach a value of 130–300%.

In addition to the first aspect, the second aspect of the mirror-polished surface wafer according to this invention is that the flatness has a SFQR value (Site Front Least Square Range) of 0.2 $\mu$m or less.

The third aspect of this invention is that, in the method for manufacturing a semiconductor mirror-polished surface wafer whose front surface is mirror finished, prior to the mirror finishing of the front surface, at least the rear surface of the semiconductor wafer is treated by an acid spin-etching process so as to control its glossiness to a value less than that of the mirror finished front surface of the semiconductor wafer.

Further to the third aspect, the fourth aspect of this invention is that the glossiness of the rear surface of the semiconductor mirror-polished surface wafer is controled by an acid spin-etching process to reach a value of 130–300%.

Further to the fourth aspect, the fifth aspect of this invention is that the flatness of the rear surface of the semiconductor mirror-polished surface wafer is controled by an acid spin-etching process to an SFQR (Site Front Least Square Range) value of 0.2 $\mu$m or less.

This invention relates to a semiconductor wafer and a method for manufacturing the same, in which at least the rear surface of the semiconductor wafer is spin-etched by an acid-etching liquid. The front surface of the semiconductor wafer is mirror-finished and the rear surface of the semiconductor wafer is nearly mirror-like, and both surfaces can be distinguished. As described hereinafter, compared with the conventional alkali-etching process or immersion type acid-etching process, both the flatness and the glossiness of the etched surface of the semiconductor wafer treated by the acid spin-etching process are enhanced. Therefore, the load In the succeeding finishing process can be reduced and the productivity is accordingly enhanced.

The embodiment of the present invention is described hereinafter with references being made to the drawings.

Figure 1:
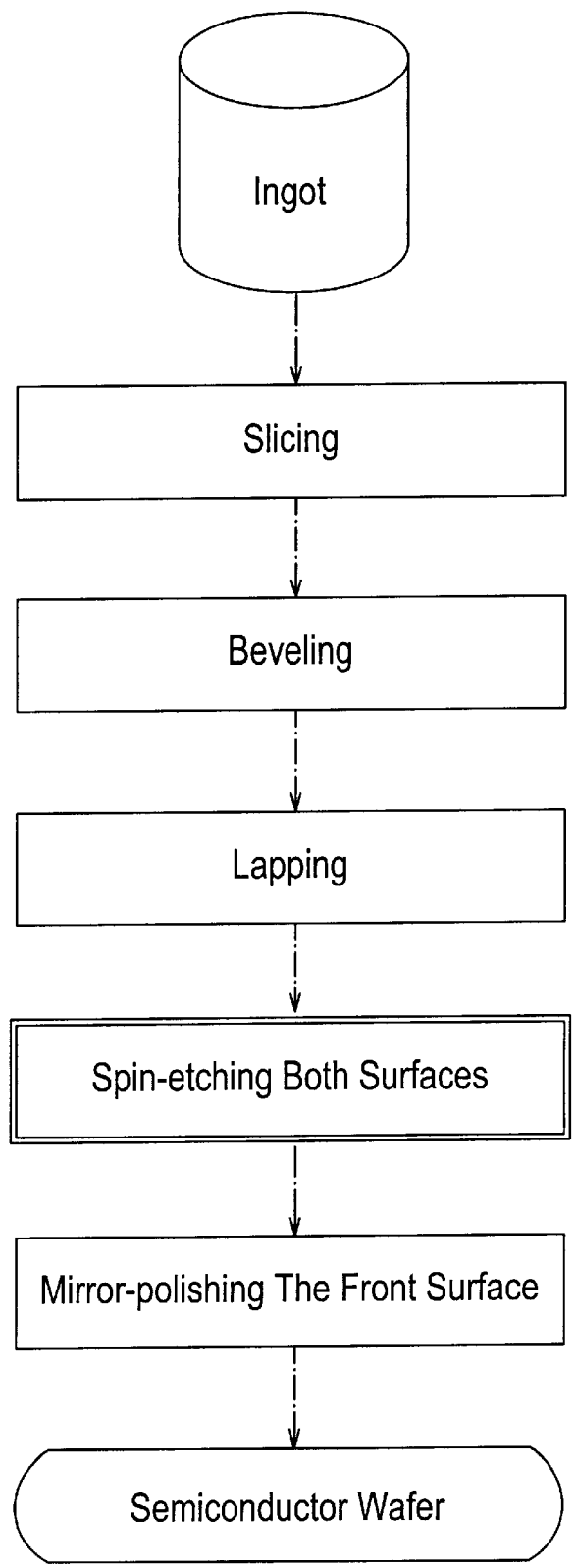
FIG. 1 is a flow chart showing the process of manufacturing semiconductor mirror-polished surface wafers according to the embodiment of this invention.

As shown in FIG. 1, the method for manufacturing semiconductor wafers comprises the following steps.

(1) Slicing a single-crystal semiconductor ingot into wafers.

(2) Beveling the peripheral rim of the sliced wafers.

(3) Lapping the front and the rear surfaces of the beveled wafers to achieve flatness of the surfaces.

(4) Acid spin-etching at least the rear surfaces of the lapped wafers so as to remove the work-strain layers produced during the lapping process, the glossiness of the rear surface of the wafer being controlled to a value of 130–300% (provided that the glossiness value of a perfect mirror surface is 330%).

(5) Polishing the front surfaces of the wafers whose front and rear surfaces have been acid spin-etched so as to obtain mirror-polished surfaces.

The following is an explanation to the changes of the glossiness and the flatness of the etched surface with respect to the thickness removed during the acid spin-etching process.

Figure 2:
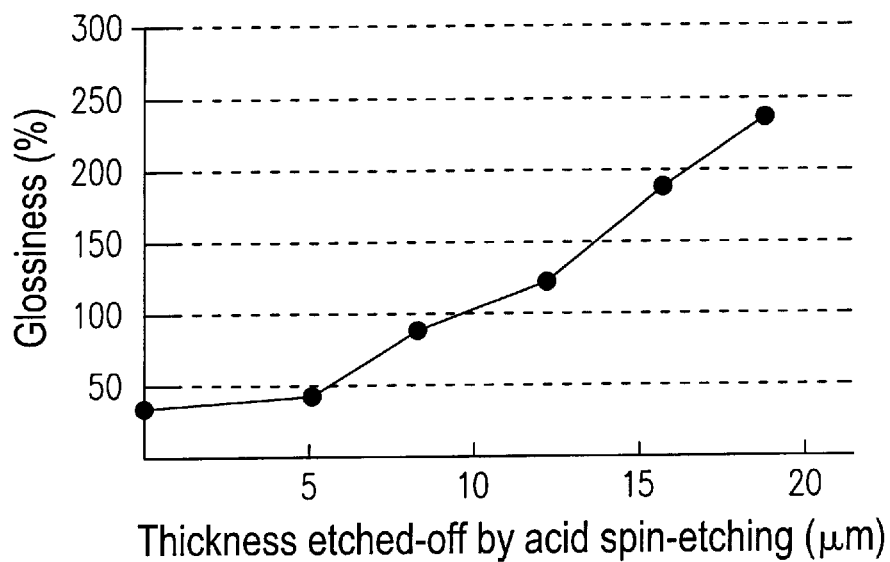
FIG. 2 is a graph showing the change of the glossiness value of the semiconductor mirror-polished surface wafers treated by the acid spin-etching process according to the embodiment of this invention.

In order to prevent the adverse effect of the particulate dust coming from the rear surface to the front surface, it is ordinarily required that the rear surface to have a glossiness value of 130% or greater. As shown in FIG. 2, to obtain such a glossiness value, a thickness of at least 12 $\mu$m has to be etched-off from the rear surface of the lapped wafer during the acid spin-etching process.

Furthermore, a mixed acid is employed as the etchant liquid in the above acid spin-etching process. The mixed acid can be a mixture of acids selected from the group of hydrofluoric acid, nitric acid, sulfuric acid, and phosphoric acid.

Figure 3:
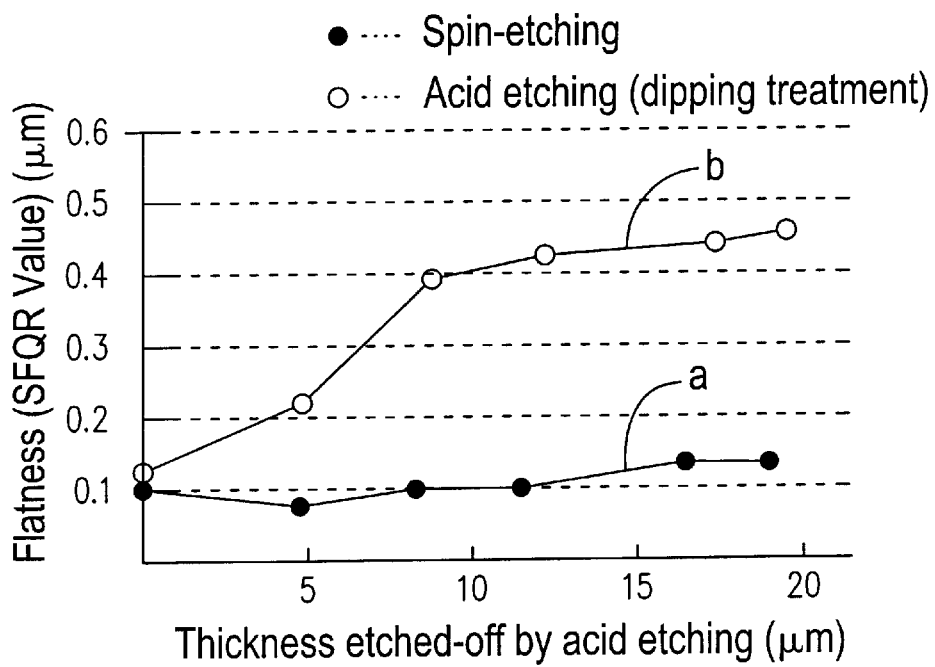
FIG. 3 is a graph showing the comparison between the flatness variation of the semiconductor mirror-polished surface wafers treated by the acid spin-etching process according to the embodiment of this invention and that treated by the immersion type acid-etching process.

Concerning the change of the flatness, as shown by the graph a of FIG. 3, although the flatness slightly declines when the etched-off thickness is 15 $\mu$m. the target SFQR value of 0.2 $\mu$m can be obtained regardless of the etched-off thickness. At the same time, the required glossiness value mentioned above can also be attained.

Conversely, as shown by the graph b of FIG. 3, in the conventional immersion-type acid-etching process, the flatness steadily declines as the etched-off thickness is increased. Therefore, it is impossible to produce a high-flatness semiconductor mirror-polished surface wafer with an acid-etched rear surface by a conventional immersion-type acid-etching process.

The comparison between this embodiment and the method disclosed in Japanese Patent Laid-open No. 6-349795, with respect to manufacturing efficiency, is listed in the following Table 1.

TABLE 1

| Name of Process | This Embodiment Work Time | This Embodiment Eched off Thickness | Conventional Method Work Time | Conventional Method Etched off Thickness |
|---|---|---|---|---|
| Alkali-Etching | — | — | 1 min/piece | 20 $\mu$m |
| Acid Spin-Etching | Front Surface 2 min/piece | 10 $\mu$m | — | — |
|  | Rear Surface 2 min/piece | 10 $\mu$m |  |  |
| Rear Surface Polishing | — | — | 6 min/piece | 3 $\mu$m |
| Front Surface Polishing | 4 min/piece | 2 $\mu$m | 15 min/piece | 10 $\mu$m |
| Summation | 8 min/piece | 22 $\mu$m | 22 min/piece | 33 $\mu$m |

In this embodiment, acid spin-etching is applied on both sides of the wafer. As a result, the total work time required for finishing one wafer into a mirror-polished surface wafer is cut down to a value less than 40% of that in conventional methods employing the alkali etching. Of course, even in the case that the acid spin-etching is applied to the rear surface only, the required work time is also shortened in comparison with conventional methods.

In the conventional method, the flatness of the rear surface achieved in the alkali etching process tend to be diminished by the rear surface polishing. Especially, it is common for bias-wearing to be brought about in the single side polishing process. Compared with conventional methods, the flatness is enhanced by the acid spin-etching process, and high-quality wafers can be obtained according to this invention.

Besides, comparing spin-etching with rear surface polishing, the unit manufacturing cost of spin-etching is lower than that of rear surface polishing if the material employed is taken into consideration.

Note that though the etching liquid employed in this embodiment can be hydrofluoric acid, nitric acid, sulfuric acid, or phosphoric acid, it is also acceptable to use a mixed acid or an aqueous solution thereof. The mixed acid can be a mixture of at least two acids selected from the group of hydrofluoric acid, nitric acid, sulfuric acid, and phosphoric acid.

As described above, according to this invention, the following advantages can be achieved in the process of manufacturing a mirror-polished surface semiconductor wafer whose front and rear surfaces can be distinguished.

(1) Compared with the semiconductor wafers whose rear surface is polished, higher flatness can be attained.

(2) Particulate residue, dust generation and metal contamination induced during alkali etching processes can be avoided.

(3) Compared with conventional process of manufacturing a semiconductor wafer whose front and rear surfaces can be identified, the etched-off thickness in this invention is small and the required work time is short. Therefore, the productivity is high.

(4) Compared with other etching processes, the etching rate of the spin-etching process employing acid etching liquid is easier to be controlled. Therefore, the glossiness of the rear surface can be arbitrarily selected.

What is claimed is:

1. A method for manufacturing a semiconductor wafer, comprising the steps of:

slicing a wafer from a single-crystal semiconductor ingot;

lapping front and rear surfaces of the wafer so as to flatten the front and rear surfaces;

spin-etching at least the rear surface of the lapped wafer until a glossiness of the at least the rear surface is increased with respect to a glossiness at commencement of the spin-etching; and mirror-polishing the front surface of the wafer, thereby obtaining a mirror surface.

2. A method for manufacturing a semiconductor wafer according to claim 1, wherein glossiness of the rear surface of the wafer is controled to a value of 130–300%.

3. A method for manufacturing a semiconductor wafer according to claim 2, wherein flatness of at least the rear surface of the wafer is controlled to an SFQR (Site Front Least Square Range) value of 0.2 μm or less by the spin-etching process.

4. A method for manufacturing a semiconductor wafer according to claim 1, further comprising distinguishing the rear surface from the front surface based on the rear surface having a lower glossiness value than the front surface.

5. A method for manufacturing a semiconductor wafer according to claim 1, further comprising beveling a peripheral rim of the sliced wafer.

6. A semiconductor wafer manufactured using the method according to claim 1.

7. A method for manufacturing a semiconductor wafer, comprising the steps of:

slicinig a wafer from a single-crystal semiconductor ingot;

lapping front and rear surfaces of the wafer so as to flatten the front and rear surfaces;

spin-etching the rear surface of the lapped wafer;

spin-etching the front surface of the wafer prior to any mirror-polishing of the front surface of the wafer; and mirror-polishing the front surface of the wafer, thereby obtaining a mirror surface.

8. A semiconductor wafer manufactured using the method according to claim 7.

9. A method for manufacturing a semiconductor wafer, comprising the steps of:

slicing a wafer from a single-crystal semiconductor ingot;

lapping front and rear surface of the wafer so as to flatten the front and rear surfaces;

etching off a thickness of at least 12 μm from the rear surface of the lapped wafer by spin-etching; and mirror-polishing the front surface of the wafer, thereby obtaining a mirror surface.

10. A semiconductor wafer manufactured using the method according to claim 9.

* * * * *